United States Patent [19]

Graeme et al.

[11] Patent Number: 5,053,718
[45] Date of Patent: Oct. 1, 1991

[54] FEEDBACK CONTROL REDUCING SIGNAL DISTORTION PRODUCED BY DIFFERENTIAL AMPLIFIER STAGE

[75] Inventors: Jerald G. Graeme; Steven D. Millaway, both of Tucson, Ariz.

[73] Assignee: Burr-Brown Corporation, Tucson, Ariz.

[21] Appl. No.: 547,997

[22] Filed: Jul. 3, 1990

[51] Int. Cl.$^5$ ............................................. H03F 3/45
[52] U.S. Cl. ..................................... 330/260; 330/311
[58] Field of Search ........................ 330/149, 260, 311

[56] References Cited

U.S. PATENT DOCUMENTS

| | | | |
|---|---|---|---|
| 3,399,357 | 8/1968 | Weilerstein | 330/260 |
| 4,146,844 | 3/1979 | Quinn | 330/149 |
| 4,692,712 | 9/1987 | Quinn | 330/261 |
| 4,743,861 | 5/1988 | Jove et al. | 330/260 |
| 4,847,566 | 7/1989 | Lee | 330/253 |
| 4,897,611 | 1/1990 | Laber et al. | 330/253 |
| 4,904,952 | 2/1990 | Tanimoto | 330/252 |

OTHER PUBLICATIONS

"A Positive-Feedback Transconductance Amplifier with Applications to High-Frequency, High-Q CMOS Switched-Capacitor Filters", by Laber and Gray, *IEEE Journal of Solid-State Circuits*, vol. 23, No. 6, Dec. 1988, pp. 1370-1378.
"A Monolithic 10-Bit A/D Using I$^2$L and LWT Thin--Film Resistors", by A. P. Brokaw, *IEEE Journal of Solid-State Circuits*, vol. SC-13, No. 6, Dec. 1978, pp. 736-745.

*Primary Examiner*—James B. Mullins
*Attorney, Agent, or Firm*—Cahill, Sutton & Thomas

[57] ABSTRACT

A low distortion differential amplifier circuit includes a primary differential circuit stage and a secondary differential circuit stage. The primary differential circuit stage includes first and second transistors each having a first current source coupled to the emitters of the first and second transistors. A first load device is coupled to the collector of the second transistor. The secondary differential circuit stage includes third and fourth transistors. A second current source is coupled to the emitters of the third and fourth transistors. The bases of the third and fourth transistors are coupled to the collectors of the first and second transistors, respectively. A second load device is coupled to the collector of the fourth transistor. A fifth transistor has its emitter and collector coupled to a supply voltage conductor and the base of the third transistor, respectively. The base of the fifth transistor is coupled to the collector of the fourth transistor, whereby the secondary differential circuit stage maintains the second current-carrying electrodes of the first and second transistors at equal voltages to reduce distortion due to differences in voltages between the control electrode and second current-carrying electrode of the first and second transistors.

20 Claims, 2 Drawing Sheets

FEEDBACK CONTROL REDUCING SIGNAL DISTORTION PRODUCED BY DIFFERENTIAL AMPLIFIER STAGE

BACKGROUND OF THE INVENTION

The invention relates to elimination of signal distortion in a differential amplifier caused by nonlinear characteristics of the emitter-base junctions and the collector-base junctions of the input transistors of the differential amplifier.

Signal distortion in a differential amplifier circuit is caused mainly by nonlinear characteristics of the input transistors, such as input transistors 2 and 3 in FIG. 1 (which shows a typical differential amplifier circuit stage). An input voltage difference between $e_1$ and $e_2$ produces a difference in the emitter-base voltages of transistors 2 and 3, resulting in different currents in those transistors. Since the transistor voltage-current relationship of transistors 2 and 3 is exponential rather than linear, the different currents in transistors 2 and 3 are a major source of distortion. That is, transistors 2 and 3 operate on significantly different parts of their identical, nonlinear current-voltage characteristic curves. This produces distortion in the otherwise linear performance of the differential amplifier stage 1. If the gain of stage 1 can be increased sufficiently, the magnitude of the differential input voltage applied between the bases of transistors 2 and 3 can be reduced, then transistors 2 and 3 operate at nearly the same point on their respective identical voltage-current characteristic curves, and distortion can be greatly reduced.

FIG. 1A shows the transfer curve 7 of the differential amplifier stage 1 of FIG. 1. For small deviations, (i.e., 10–15 millivolts) of $\Delta e_1$ (note that $\Delta e_1 = e_2 - e_1$) from the origin of the transfer curve 7, the curve is quite linear for small applied differential input voltages. The larger the deviation, the greater the distortion. As an example, a large 30 millivolt differential input voltage produces approximately two percent distortion in the output signal $e_0$, whereas it generally is desirable that the distortion be kept in the 0.1 percent range, which can be achieved if the differential input voltage $e_2 - e_1$ is less than several millivolts.

Similarly, collector-base voltage swings of input transistors 2 and 3 produce distortion because the identical current-voltage curves of transistors 2 and 3 are quite nonlinear with respect to collector-emitter voltage. Furthermore, the collector junction capacitances of transistors 2 and 3 are highly nonlinear as a function of collector-base voltage. Curve 8 in FIG. 1B shows a nonlinear collector current curve of a transistor such as input transistors 2 and 3. Curve 8 characterizes the "resistive effect" of the input transistors 2 and 3. The slope of the collector-base, current-voltage characteristic of FIG. 1B represents the output impedance of the transistor. At low frequencies, capacitive effects are avoided so the slope of FIG. 1B actually represents the resistive portion of the transistor output impedance. This curve demonstrates a linear region where changes in voltage produce little change in current and this suggests linear operation.

However, added to this low-frequency or resistive output impedance is the capacitive impedance of the collector-base junction capacitance. This capacitance is in parallel with the resistive output impedance and this capacitance also alters collector current. At frequencies above the low frequency domain of FIG. 1B, the capacitive impedance drops with frequency and takes control of the transistor output impedance. This capacitance has a highly nonlinear voltage sensitivity that introduces response nonlinearity.

Curve 9 in FIG. 1C shows the relationship between collector-base junction capacitance and collector-base voltage for transistors 2 and 3. Comparing FIGS. 1B and 1C shows that the nonlinearity of $C_{CB}$ extends through the $C_{CB}$ range for which the FIG. 1B is linear. Thus, at other than low frequencies, the output impedance of bipolar transistors is a highly nonlinear function of the collector-base voltage. Due to this nonlinear output impedance, the collector currents in FIG. 1 vary nonlinearly as the collector-base voltage varies in order to support an output voltage. Analogous results occur with transistors other than the bipolar type illustrated here.

To eliminate distortion, it is desirable to eliminate or "balance" voltage swings on the emitter-base junctions and collector-base junctions of input transistors 2 and 3. Stated differently, it is desirable to simultaneously maintain like voltages on like junctions during circuit operation.

In the past, the general approach to solving the above problems of the prior art has been to compensate the distortion by generating counteracting nonlinear signals. U.S. Pat. No. 4,146,844 addresses the problem of distortion associated with the emitter-base junctions of input transistors of a differential amplifier. The nonlinearity associated with the base-emitter voltages of transistors 70 and 72 of U.S. Pat. No. 4,146,844 follows the general transfer curve of FIG. 1A which, however, is modified by the presence by emitter degeneration resistance 75, which extends the linear range of the transfer response. To compensate for the nonlinearity, U.S. Pat. No. 4,146,844 provides two additional transistors 100 and 102 connected so as to develop a nonlinearity that is opposite in shape to that generated by transistors 70 and 72 and then sum the counteracting distortion signals with those produced by nonlinearities of transistors 70 and 72. Transistors 100 and 102 of U.S. Pat. No. 4,146,844 sense signals from both sides of the differential stage by virtue of cross-coupling resistors 116 and 117 and input resistors 115 and 118. However this technique is difficult to implement because of the difficulty of generating a nonlinearity exactly equal and opposite to that of the one to be compensated for. (It should be appreciated that any compensation technique is always inherently limited by the degree to which the manufacturing process can control the matching of components, such as resistors. Our experience is that compensation techniques can reduce signal distortion by a factor of about 10.)

U.S. Pat. No. 4,692,712 discloses compensating for effects of nonlinear junction capacitances of input transistors 2 and 3 and the nonlinear output resistances of transistors 2 and 3. Input transistors $Q_1$ and $Q_2$ have nonlinear capacitance and nonlinear output resistance characteristics due to their different collector-base voltages. This results in distortion errors in their respective collector currents. In U.S. Pat. No. 4,692,712, additional transistors $Q_7$ and $Q_8$ are provided to match input transistors $Q_1$ and $Q_2$, respectively. These transistors are connected so that $Q_7$ and $Q_8$ experience the same collector-base voltage swings as transistors $Q_1$ and $Q_2$, respectively. The collector currents of $Q_7$ and $Q_8$ are cross-coupled to the collectors of $Q_2$ and $Q_1$, respectively, so that a nonlinear variation in the collector current of $Q_2$ is replicated in the collector current of $Q_1$, and vice versa. As in most compensation schemes, this one depends on the accuracy of matching resistors and other components in a practical integrated circuit manufacturing process.

Perhaps the closest prior art is U.S. Pat. No. 4,897,611. This reference attempts to eliminate the source of nonlinear signal distortion, rather than compensate for it. However, its general approach is distinctly different in two ways from the approach of the present invention. This reference uses positive feedback to create a signal that will remove the gain error signal of a differential amplifier stage. The first differential stage serves as a voltage to current converter. The resulting differential currents are transmitted through cascode devices to input FETs of the second stage in which positive feedback is provided by $Q_{24}$ within the second differential stage (which is nested within the first). The nested differential stage is configured so as to monitor any voltage difference between the drain of $Q_{13}$ and the drain of $Q_{11}$. The current in the drain of $Q_{24}$ is conducted to the opposite side of the nested differential stage. $Q_{23}$ and $Q_{24}$ receive the same input signal, but conduct currents to opposite sides of the differential stage, the drain of $Q_{24}$ thereby providing positive feedback. That causes the right side of the nested differential stage to track the left side. The voltage on the drain of $Q_{13}$ tracks with the voltage on the drain of $Q_{11}$, so any changes in voltage caused by junction capacitances of $Q_{11}$ will be tracked by changes in junction capacitance of $Q_{13}$.

The stated objective of U.S. Pat. No. 4,897,611 is a differential stage with significantly improved voltage gain. Such gain is also achieved in the course of the operation described above. It is achieved by forcing the differential output of the stage to near zero voltage without reducing the single-ended output voltage. The positive feedback forces the drain voltages of $Q_{11}$ and $Q_{13}$ to track, and this action reduces the differential output voltage of the stage almost to zero. Yet, the single-ended output voltage of the stage remains available to be used as the final circuit output. With near zero differential output voltage, very little differential input voltage is required for the stage. By retaining the single-ended output, a high gain results between the small differential input signal and the single-ended output voltage. This high gain theoretically equals the product of the gains of the two differential stages.

However, positive feedback is likely to cause circuit oscillations and latching. To safely use positive feedback, it is necessary to back off considerably from theoretical design limits. Even when oscillation and latching does not occur, signal responses tend to be characterized by "ringing" or decaying oscillations before output signal levels stabilize. This technique effectively reduces the distortion associated with junction capacitances of $Q_{13}$, $Q_{11}$, $Q_{20}$, and $Q_{17}$, which are large output devices subject to large signal swings and are the primary cause of distortion.

U.S. Pat. No. 4,743,861 discloses techniques for accomplishing broader bandwidth by use of emitter degeneration resistors in a differential circuit stage nested within another differential circuit stage, and providing feedback from the nested differential stage to the emitter circuitry of the primary differential stage to produce a high frequency zero in the frequency response of the circuit.

There remains an unmet need for an improved technique for reducing distortion in differential amplifier circuits due to nonlinearities in the input transistors thereof.

SUMMARY OF THE INVENTION

Accordingly, it is an object of the invention to provide a differential amplifier stage which effectively reduces distortion due to emitter-base voltage variations and collector-base voltage variations on input transistors of the differential amplifier stage more effectively than the prior art.

It is another object of the invention to provide a differential amplifier stage with lower distortion and higher bandwidth than the closest prior art.

It is another object of the invention to provide a differential amplifier stage with greater voltage gain than the closest prior art.

Briefly described, and in accordance with one embodiment thereof, the invention provides a low distortion differential amplifier circuit including a primary differential circuit stage with first and second transistors each having first and second current-carrying electrodes and a control electrode and a first current source coupled to the first current-carrying electrodes of the first and second transistors. A first load device is coupled to the second current-carrying electrode of the second transistor. A secondary differential circuit stage includes third and fourth transistors each having first and second current-carrying electrodes and a control electrode. A second current source is coupled to the first current-carrying electrodes of the third and fourth transistors. The base electrodes of the third and fourth transistors are coupled to the second current-carrying electrodes of the first and second transistors, respectively. A second load device is coupled to the second current-carrying electrode of the fourth transistor. A fifth transistor has first and second current-carrying electrodes coupled to a supply voltage conductor and the control electrode of the third transistor, respectively. A control electrode of the fifth transistor is coupled to the second current-carrying electrode of the fourth transistor, whereby the secondary differential circuit stage maintains the second current-carrying electrodes of the first and second transistors at equal voltages to reduce distortion due to differences in voltages between the control electrode and second current-carrying electrode of the first and second transistors. The fifth transistor produces gain that multiplies the combined gains of the primary and secondary circuit stages to reduce a differential input voltage required between the control electrodes of the first and second transistors to produce a predetermined output voltage on the current-carrying electrode of the second transistor. In another described embodiment, the first load device includes a sixth transistor having a base coupled to a base of the fifth transistor and a collector coupled to a collector of the second transistor. A resistor is coupled between a supply voltage conductor and the emitters of the fifth and sixth transistors to increase gain of the differential amplifier. First and second emitter degeneration resistors couple the second current source to emitters of the third and fourth transistors, respectively, to decrease the gain and correspondingly increase the bandwidth of the low distortion differential amplifier circuit.

In another embodiment, the emitters of the first and second transistors are not connected to a current source, as in the foregoing embodiments. A differential input stage includes sixth and seventh transistors and a third load device coupled to a collector of the sixth transistor and to an emitter of the first transistor, a fourth load device coupled to a collector of the seventh transistor and to an emitter of the second transistor, and a second current source coupled to the first current-carrying electrodes of the sixth and seventh transistors. The bases of the first and second transistors are biased at a suitable bias voltage.

DETAILED DESCRIPTION OF THE PREFERRED EMBODIMENTS

Figure 1:
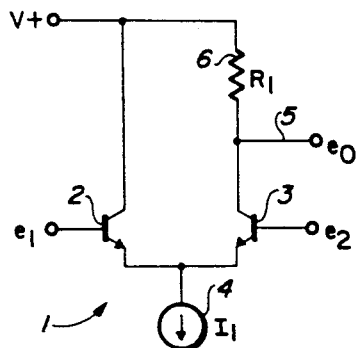
FIG. 1 is a schematic diagram of a prior art differential amplifier.

The general approach of the present invention is to produce very high gain in a differential amplifier stage so that low differential input voltages can produce a desired output voltage level, thereby resulting in operation of the input transistors such as 2 and 3 of FIG. 1 in linear, nearly identical portions of their current-voltage characteristic curves. Furthermore, a differential feedback technique is employed to force the collector voltages of both input transistors to be at identical voltages in order to remove effects of the above-described nonlinearity associated with the collector-base junctions of input transistors such as 2 and 3 of FIG. 1.

Figure 2:
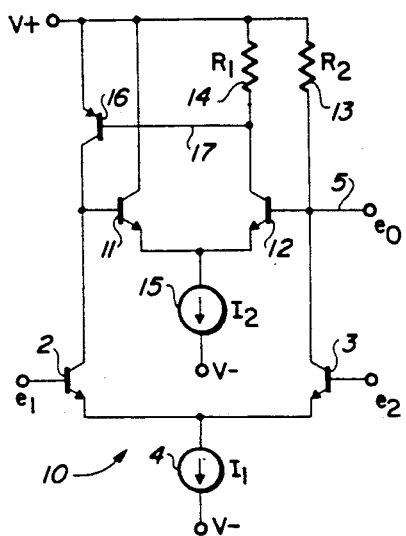
FIG. 2 is a schematic circuit diagram of one embodiment of the invention.
Figure 1C:
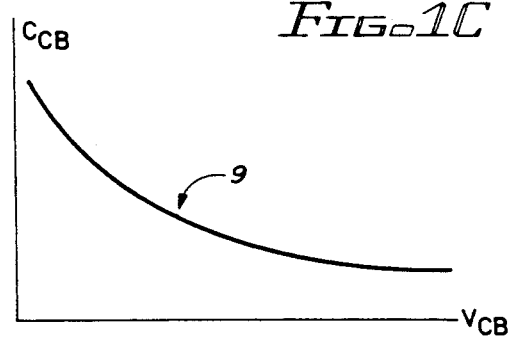

FIG. 2 shows a basic embodiment of the present invention. This embodiment is a differential amplifier 10 including two NPN input transistors 2 and 3 having their emitters connected in common to a current source 4. Input signals $e_1$ and $e_2$ are applied to the bases of transistors 2 and 3, respectively. The collector of transistor 2 is connected to the base of NPN transistor 11 and to the collector of PNP transistor 16. The collector of transistor 3 is connected by output conductor 5, on which an output signal $e_0$ is produced, to the base of NPN transistor 12 and to one terminal of resistor 13 (the resistance of which is $R_2$). The emitters of transistors 11 and 12 are connected in common to a current source 15. The collector of transistor 11 is connected to V+. The collector of transistor 12 is connected by conductor 17 to the base of transistor 16 and to one terminal of resistor 14 (the resistance of which is $R_1$). The emitter of transistor 16 is connected to V+. Terminals of resistors 14 and 13 are connected to V+. The differential stage including transistors 2 and 3 is referred to as "primary differential stage 2, 3," and the stage including transistors 11 and 12 is referred to as a "secondary differential stage 11, 12."

The above differential amplifier 10 reduces distortion by substantially removing differential signals from the junctions of transistors 2 and 3. The secondary differential stage 11, 12 "nested" within the primary differential stage 2, 3 is connected so as to provide high gain negative feedback control of the collector voltage of transistor 2. This feedback forces the collector voltage of transistor 2 to accurately follow the collector voltage of transistor 3, since the operation of the secondary differential stage 11, 12 tends to maintain the input voltages applied to the bases of transistors 11 and 12 at equal values. Therefore, the collectors of transistors 2 and 3 have matched current losses to their nonlinear impedances. That is, with no difference in these losses there is no difference current created between the collector currents of transistors 2 and 3. Any such difference current would require a difference voltage between the inputs of the primary differential stage. When such a difference current results from nonlinear impedances, the resulting input voltage is also nonlinear and represents a distortion signal. By balancing the collector circuit losses to nonlinear impedances, no difference current results. Such current losses are now of a common mode nature, rather than a differential nature, and as such are rejected by the common mode rejection of the primary differential stage 2, 3. Distortion due to differences in collector-base voltage signals of transistors 2 and 3 is thereby removed by such common mode rejection.

Figure 1A:
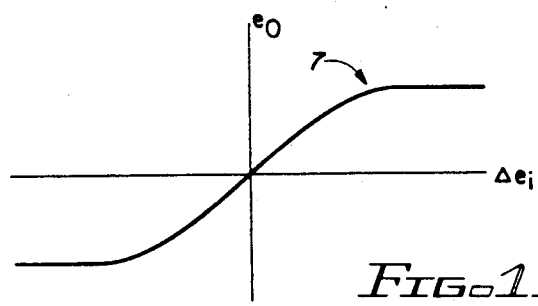
FIGS. 1A-1C are graphs useful in describing characteristics of the input transistors of a differential amplifier circuit stage.
Figure 1B:
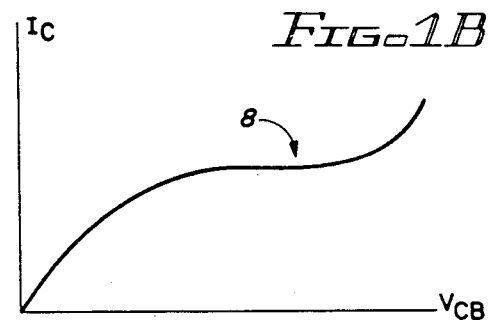

Distortion due to emitter-base voltage changes is removed as a result of greatly increased circuit gain of the configuration shown in FIG. 2. The total gain of the differential amplifier 10 is so high that a very small differential input voltage $e_2 - e_1$ is required to produce the maximum desired value of $e_0$. Therefore, transistors 2 and 3 have virtually identical currents and hence operate at almost the same point on their identical current voltage characteristic curves; operation is very close to the origin in the transfer curve of FIG. 1A, where the curve 7 is quite linear. This distortion due to emitter-base signal voltages is removed as a result of the greatly increased circuit gain.

Further, the present invention produces circuit gain that is substantially greater than the theoretical gain of the prior circuit of FIG. 1. The voltage gain of the differential amplifier 10 of FIG. 2 is the product of the gains of the two differential stages, multiplied by the gain of common-emitter transistor 16. In addition to serving as a load to transistor 2, transistor 16 is driven by the second differential stage and adds gain to the feedback control. This gain is $g_{m16}(R_{O2} \| R_{O16})$ where $R_{O2}$ and $R_{O16}$ are the output resistances of transistor 2 and transistor 16. (The symbol "$\|$" means "in parallel with".) For the differential stages voltage gains are $(g_{m2} \| g_{m3})R_2$ and $(g_{m11} \| g_{m12})R_1$. Thus, the net voltage gain for FIG. 2 is:

$$A \leq (g_{m2} \| g_{m3})(g_{m11} \| g_{m12})g_{m16}R_1R_2(R_{O2} \| R_{O16})$$

With three stages of gain, rather than two, the gain of the circuit of FIG. 2 is considerably higher than that of the prior circuit of U.S. Pat. No. 4,897,611.

Figure 3:
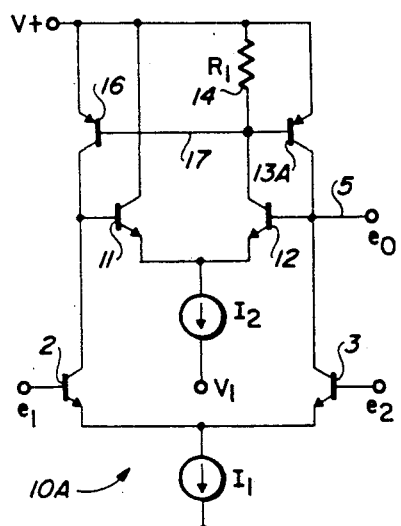
FIG. 3 is a schematic circuit diagram of another embodiment of the invention.

FIG. 3 shows another embodiment 10A, in which load resistor 13 of transistor 3 is replaced by a PNP transistor 13A. The nonlinear output impedance of transistor 13A balances the effect of the nonlinear output impedance of transistor 16. More specifically, the nonlinear output impedance of transistor 13A produces its own distortion effects that counteract the distortion effects of the identical nonlinear output impedance of transistor 16. The base of transistor 16 alternatively can be biased from a fixed voltage source, but the connection shown is simple and adds further voltage gain, which results from positive feedback supplied through transistor 13A to the base of transistor 12. The circuit of FIG. 3 produces a small amount of positive feedback generated in the loop containing transistors 12 and 13A, although the amount of gain achieved thereby is minimal compared with the amount of negative feedback between $e_0$ and $e_1$ For example, the negative feedback component of the circuit may produce a gain boost of 68 decibels, supplemented by an additional 12 decibels of gain boost resulting from the positive feedback of the circuit. Normally, positive feedback is avoided, but in this case the resulting additional gain is small (smaller by a factor of about 400) compared to that gain which is already achieved by negative feedback. The overall dominant negative feedback results in much more "well behaved" circuit operation.

Figure 4:
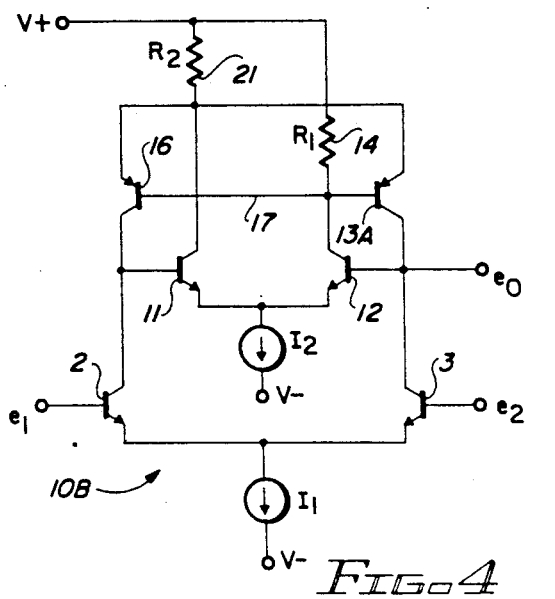
FIG. 4 is a schematic circuit diagram of another embodiment of the invention.

Another embodiment of the invention is shown in FIG. 4, in which resistor 21 is connected between the emitters of transistors 16 and 13A and V+ and resistor 14 is connected directly to V+. This embodiment results in increased circuit gain, because transistors 13A and 16 are driven at their emitters by transistor 11 in a common base mode. More specifically, this circuit takes advantage of gain that is available from the collector of transistor 11 to increase the overall gain of the circuit, whereas in the earlier embodiments, the collector of transistor 11 is just connected to V+. In FIG. 4, the emitters of transistors 13A and 16 are driven by the collector of transistor 11 so the available gain is used, rather than wasted. This not only increases the circuit gain, but by driving the emitters of transistors 13A and 16 instead of the bases, substantially higher bandwidth is achieved because of the common-base operation of transistors 13A and 16. The collector of transistor 12 drives the bases of transistors 13A and 16, driving them in a common emitter mode, with lower bandwidth. As an alternative, the collector of transistor 12 could be connected to V+, and transistors 13A and 16 could be driven only at their emitters by the collector of transistor 11, and the bases of transistors 13A and 16 could be connected to a fixed bias voltage. This embodiment also results in greater bandwidth due to the common emitter configuration of transistors 13A and 16.

Figure 5:
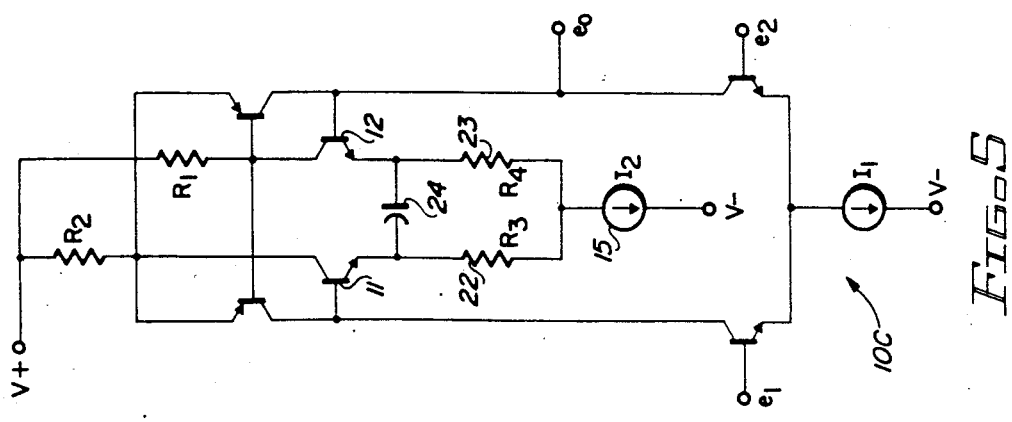
FIG. 5 is a schematic circuit diagram of another embodiment of the invention.

The embodiment 10C of the invention shown in FIG. 5 results in even greater bandwidth than the circuit of FIG. 4, by addition of emitter degeneration resistors 22 and 23 in series with the emitters of transistors 11 and 12, respectively. At low frequencies, resistors 22 and 23 degenerate the gain of the secondary differential stage 11, 12, providing higher bandwidth. At higher frequencies, capacitor 24 bypasses resistors 22 and 23 to increase the gain boost, producing a "response zero" that can be made to cancel the second pole of the differential amplifier stage 10C. (It should be appreciated that the gain of a differential stage is roughly equal to the impedance of the collector circuits divided by the impedance of the emitter circuits, or $A=Z_C/Z_E$, where A is the gain of the differential stage, $Z_C$ is the impedance of the collector circuit, and $Z_E$ is the impedance of the emitter circuit. In FIG. 5 the secondary stage has an emitter circuit resistance $Z_E$ of $R_3+R_4$, and this sets the low frequency emitter circuit impedance. Thus, at low frequency the gain is $A=Z_C/(R_3+R_4)$. At some higher frequency, capacitor 24 forms a pole with the resistance $(R_3+R_4)$ causing a rolloff of the emitter impedance. Thus, the denominator of the gain expression decreases with frequency. This means that the gain A increases with frequency at the same rate that its denominator decreases. The rising gain is the sign of a response zero in the gain response. So, a pole for the emitter circuit impedance is a zero for the stage gain.)

Figure 6:
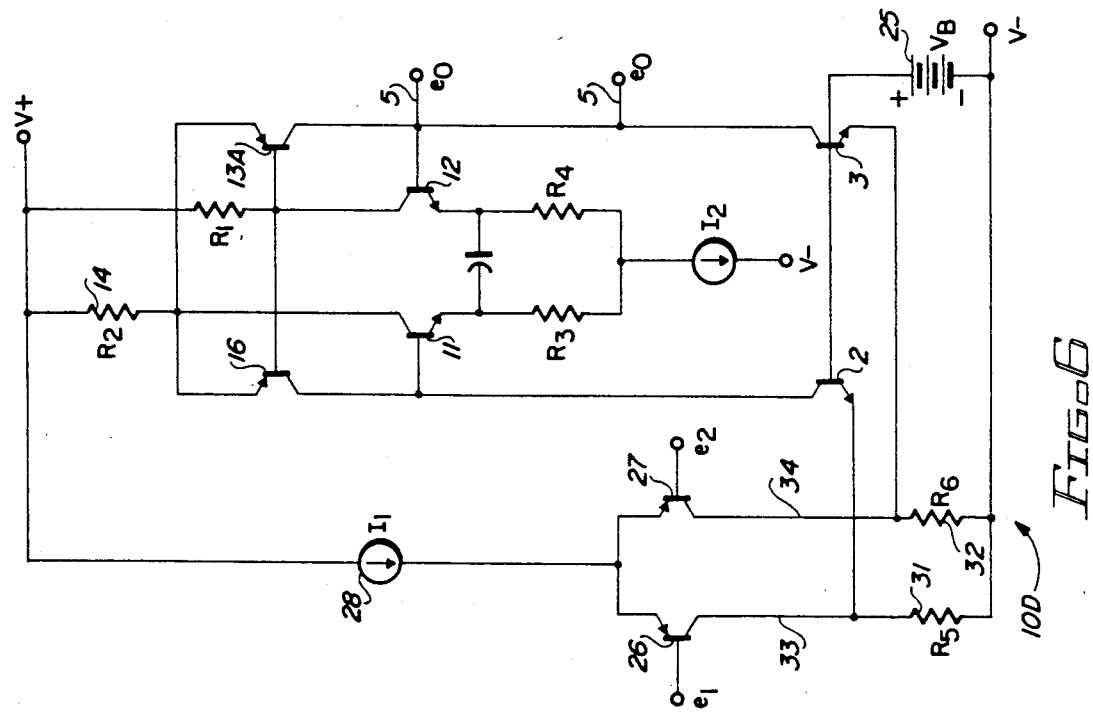
FIG. 6 is a schematic circuit diagram of another embodiment of the invention.

The embodiment 10D shown in FIG. 6 utilizes a "folded cascode" differential amplifier in which the bases of transistors 2 and 3 are connected to the fixed bias voltage 25. A differential amplifier includes PNP transistors 26 and 27, current source 28, and load resistors 31 and 32. Input signals $e_1$ and $e_2$ are applied to the bases of transistors 26 and 27, respectively. "Intermediate" output signal currents in conductors 33 and 34 are conducted directly to the emitters of transistors 2 and 3, respectively, in response to the difference signal $e_2-e_1$. Transistors 2 and 3 function as cascode transistors biased by voltage source 25. A very low emitter impedance of transistors 2 and 3 is presented to the collectors of transistors 26 and 27, and results in very small signal variations of the emitters of transistors 2 and 3. The common base connection of transistors 2 and 3 results in very high bandwidth. The circuit 10D of FIG. 6 is capable of producing 100 DB gain at a frequency of 10 megahertz, using the lowest cost monolithic analog integrated circuit manufacturing process utilized by the assignee. This performance is believed to be very impressive.

Figure 7:
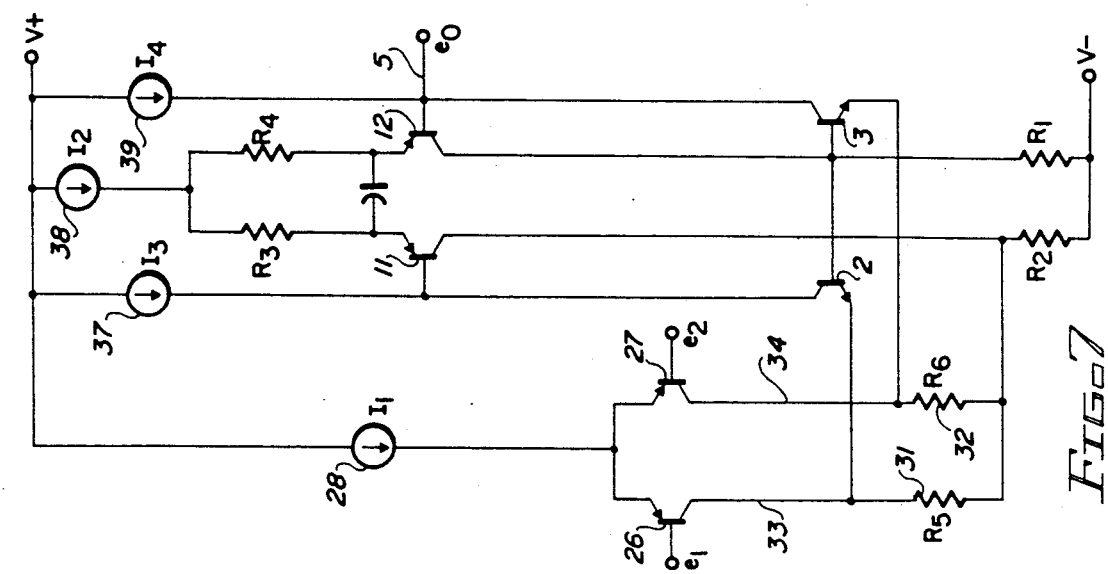
FIG. 7 is a schematic circuit diagram of another embodiment of the invention.

The embodiment 10E of FIG. 7 operates similarly identically to the embodiment 10D of FIG. 6. FIGS. 6 and 7 have analogous bias conditions and signal conditions. For bias conditions FIG. 7 is identical to FIG. 6 except that points of fixed bias and distortion correction drive are interchanged. In FIG. 6 bias voltage $V_B$ produces relatively fixed voltages on resistor 31 ($R_5$) and resistor 32 ($R_6$). The resulting resistor currents are supplied by transistors 2 and 26 and transistors 3 and 27, respectively. Bias currents in transistors 26 and 27 are fixed by current source 28. Thus, currents must be supplied through transistors 2 and 3 to make up the difference in $R_5$ and $R_6$ currents. Resulting currents drawn through these transistors stimulate transistors 11 and 12 causing the secondary stage to apply appropriate drive to transistors 13A and 16. Then, the latter transistors supply the currents demanded by transistors 2 and 3.

In FIG. 7, the fixed and driven bias controls are reversed. Current sources 37 and 39 become the source of fixed bias for the cascode side of the stage. These current sources stimulate transistors 11 and 12, causing the secondary stage to drive the cascode transistors 2 and 3. Then, the latter transistors accept the currents supplied by current sources 37 and 39 and supply these currents to $R_5$ and $R_6$. These resistors also receive currents from transistors 26 and 27 in the same manner described for FIG. 6.

Under signal conditions, the gain added by the secondary stage again acts to greatly reduce the input signal of the primary stage. This in turn acts to greatly reduce the difference in the currents in transistors 26 and 27. For FIG. 6 the signal currents of transistors 26 and 27 are supplied through transistors 2 and 3 to drive the bases of transistors 11 and 12. Any difference in these signal currents must be absorbed by the bases of transistors 11 and 12 because transistors 13A and 16 supply equal currents to these same bases. Very little difference in base current is required by transistors 13A and 16 supply equal currents to these same bases. Very little difference in base current is required by transistors 13A and 16 in order to develop output voltage $e_0$. Thus, very little signal $e_1-e_2$ is required to develop the base current difference for transistors 11 and 12 and thereby support $e_0$.

Similar signal action occurs with FIG. 7. Once again, currents from transistors 26 and 27 pass through transistors 2 and 3 where these currents drive the bases of transistors 11 and 12. Any difference in these currents must be absorbed by the bases of transistors 11 and 12 because current sources 37 and 39 supply equal currents to these same bases. Again, only a small base current difference is required by transistors 11 and 12 in order to develop $e_0$.

In contrast to the circuit of FIG. 6, in which a fixed bias is applied to the bases of transistors 2 and 3, in FIG. 7, fixed bias is applied to the collectors of transistors 2 and 3 through current sources 37 and 39, respectively. Instead of driving loads of transistors 2 and 3, the bases and emitters of transistors 2 and 3 are driven. This is an alternate configuration which can be expected to give similar performance to the circuit of FIG. 6. A circuit design advantage might be that the current sources $I_2$, $I_3$, and $I_4$ might track current source $I_1$. Also, FIG. 7 permits reversing the conductivity type of transistors 11 and 12 so as to take advantage different transistor characteristics.

The differential stage formed by transistors 2 and 3 serves to force the collectors of transistors 2 and 3 to be at the same potential. That would also hold for the transistors used to generate the current sources $I_3$ and $I_4$. The nonlinear impedance of those devices would have balancing effects in the circuit by virtue of the fact that the differential drive forces the collectors of transistors 2 and 3 to be at the same potential. It does so with the collector of transistor 12 driving the base of transistors 2 and 3 and the collector of transistor 11 driving the emitter return for transistors 2 and 3.

The invention distinguishes over the disclosure of U.S. Pat. No. 4,897,611 by providing circuit gain equal to the product of the gains of the two nested differential stages multiplied by the gain of another transistor, thereby effectively providing three stages of gain in one differential stage. Therefore, the present invention provides considerably more gain and associated reduction in distortion produced by different emitter-base junction voltages of the input transistors than is achievable in the closest prior art. Further, the present invention distinguishes over the disclosure of U.S. Pat. No. 4,897,611 by providing circuit control primarily through the control of negative rather than positive feedback. Some embodiments of the invention provide feedback that includes a relatively small positive feedback component and is "well behaved", and it does not necessitate that the design by skewed away from theoretical parameter limits.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, an all FET implementation is entirely practical.

What is claimed is:

1. A low distortion differential amplifier circuit comprising in combination:
   (a) a primary differential circuit stage including first and second transistors each having first and second current-carrying electrodes and a control electrode, a first current source coupled to the first current-carrying electrodes of the first and second transistors, and a first load device coupled to the second current-carrying electrode of the second transistor;
   (b) a secondary differential circuit stage including third and fourth transistors each having first and second current-carrying electrodes and a control electrode, a second current source coupled to the first current-carrying electrodes of the third and fourth transistors, and means for coupling the control electrodes of the third and fourth transistors to the second current-carrying electrodes of the first and second transistors, respectively, and a second load device coupled to the second current-carrying electrode of the fourth transistor;
   (c) a fifth transistor having first and second current-carrying electrodes coupled to a supply voltage conductor and the control electrode of the third transistor, respectively, and a control electrode coupled to the second current-carrying electrode of the fourth transistor, whereby the secondary differential circuit stage maintains the second current-carrying electrodes of the first and second transistors at substantially equal voltages to reduce distortion due to differences in voltages between the control electrode and second current-carrying electrode of the first and second transistors, and whereby the fifth transistor produces gain that multiplies the combined gains of the primary and secondary differential circuit stages to reduce a differential input voltage required between the control electrodes of the first and second transistors to produce a predetermined output voltage on the current-carrying electrode of the second transistor.

2. The low distortion differential amplifier circuit of claim 1 wherein the first, second, third, fourth, and fifth transistors are bipolar transistors.

3. The low distortion differential amplifier circuit of claim 2 wherein the first, second, third, and fourth transistors are NPN transistors and the fifth transistor is a PNP transistor, the first current-carrying electrodes are emitters, the second current-carrying electrodes are collectors, and the control electrodes are bases.

4. The low distortion differential amplifier circuit of claim 3 wherein the first load device includes a sixth transistor, which is a transistor having a base coupled to the base of the fifth transistor and a collector coupled to the collector of the second transistor.

5. The low distortion differential amplifier circuit of claim 4 including a resistor coupled between a supply voltage conductor and the emitters of the fifth and sixth transistors.

6. The low distortion differential amplifier circuit of claim 5 including first and second emitter degeneration resistors coupling the second current source to the emitters of the third and fourth transistors, respectively, to decrease the gain and correspondingly increase the bandwidth of the low distortion differential amplifier circuit.

7. The low distortion differential amplifier circuit of claim 6 including a high frequency bypass capacitor coupled between the emitters of the third and fourth transistors to perform the function of bypassing the first and second emitter degeneration resistors at high frequencies to produce a zero at a predetermined frequency of the frequency response of the low distortion differential amplifier circuit.

8. The low distortion differential amplifier circuit of claim 1 wherein the first and second load devices include first and second resistors, respectively.

9. A low distortion diff    tial amplifier circuit comprising in combination:
  (a) a primary differential circuit stage including first and second transistors each having first and second current-carrying electrodes and a control electrode, a first load device coupled to the second current-carrying electrode of the second transistor;
  (b) a secondary differential circuit stage including third and fourth transistors each having first and second current-carrying electrodes and a control electrode, a first current source coupled to the first current-carrying electrodes of the third and fourth transistors, and means for coupling the control electrodes of the third and fourth transistors to the second current-carrying electrodes of the first and second transistors, respectively, and a second load device coupled to the second current-carrying electrode of the fourth transistor;
  (c) a fifth transistor having first and second current-carrying electrodes coupled to a supply voltage conductor and the control electrode of the third transistor, respectively, and a control electrode coupled to the second current-carrying electrode of the fourth transistor,
  (d) a differential input stage including sixth and seventh transistors each having first and second current-carrying electrodes and a control electrode, a third load device coupled to the second current-carrying electrodes of the sixth transistor and to the first current-carrying electrode of the first transistor, a fourth load device coupled to the second current-carrying electrode of the seventh transistor and to the first current-carrying electrode of the second transistor, and a second current source coupled to the first current-carrying electrodes of the sixth and seventh transistors;
  (e) means for biasing the control electrodes of the first and second transistors;
whereby the secondary differential circuit stage maintains the second current-carrying electrodes of the first and second transistors at substantially equal voltages to reduce distortion due to differences in voltages between the control electrode and second current-carrying electrode of the first and second transistors, and whereby the fifth transistor produces gain that multiplies the combined gains of the primary and secondary differential circuit stages to reduce a differential signal required between the first current-carrying electrodes of the first and second transistors to produce a predetermined output voltage on the current-carrying electrode of the second transistor.

10. The low distortion differential amplifier circuit of claim 9 wherein the first load device includes an eighth transistor having a control electrode coupled to the control electrode of the fifth transistor, a first current-carrying electrode coupled to the current-carrying electrode of the fifth transistor, and a second current-carrying electrode coupled to the control electrode of the fourth transistor.

11. The low distortion differential amplifier circuit of claim 10 including a resistor coupling the first current-carrying electrode of the fifth and eighth transistors to a supply voltage conductor.

12. The low distortion differential amplifier circuit of claim 11 wherein the first, second, third, fourth, sixth, and seventh transistors are NPN and the fifth, sixth, seventh, and eighth transistors are PNP.

13. The low distortion differential amplifier circuit of claim 12 including first and second degeneration resistors coupling the first current source to the first current-carrying electrodes of the third and fourth transistors, respectively, to decrease the gain and correspondingly increase the bandwidth of the low distortion differential amplifier circuit, and a high frequency bypass capacitor coupled between the first current-carrying electrodes of the third and fourth transistors to perform the function of bypassing the first and second emitter degeneration resistors to produce a zero at a predetermined frequency of the frequency response of the low distortion differential amplifier circuit.

14. A method of operating a differential amplifier circuit to achieve low distortion, comprising the steps of:
  (a) applying a differential input signal between control electrodes of first and second transistors of a primary differential circuit stage;
  (b) applying a differential output signal produced by the primary differential circuit stage between control electrodes of third and fourth transistors of a secondary differential circuit stage;
  (c) applying an output signal produced by the secondary differential circuit stage to a control electrode of a fifth transistor having a first current-carrying electrode coupled to a supply voltage conductor and a second current-carrying electrode coupled to a control electrode of one of the third and fourth transistors to maintain substantially equal voltages on second current-carrying electrodes of the first and second transistors.

15. The method of claim 14 including applying the output signal produced by the secondary differential circuit stage to a control electrode of a sixth transistor having a first current-carrying electrode coupled to the supply voltage conductor and a second current-carrying electrode coupled to the control electrode of the other of the third and fourth transistors to perform the further function of canceling distortion produced by the fifth transistor.

16. The method of claim 15 including boosting the gain of the differential amplifier circuit by coupling a second current-carrying electrode of the third transistor, the first current-carrying electrode of the fifth transistor, and the first current-carrying electrode of the sixth transistor to the supply voltage conductor by means of a first load device, wherein the first, second, third, and fourth transistors are NPN and the fifth and sixth transistors are PNP, the control electrodes are bases, the first current-carrying electrodes are emitters, and the second current-carrying electrodes are collectors.

17. The method of claim 16 including increasing the bandwidth of the differential amplifier circuit by reducing the gain of the secondary differential circuit stage by means of first and second emitter degeneration resistors coupling the emitters of the third and fourth transistors together, and coupling a high frequency bypass capacitor between the emitters of the third and fourth transistors.

18. A method of operating a differential amplifier circuit to achieve low distortion, comprising the steps of:
   (a) producing an intermediate differential input signal by applying a differential input signal between inputs of a differential input circuit;
   (b) applying the intermediate differential input signal between first current-carrying electrodes of first and second transistors of a primary differential circuit stage, and applying a bias voltage to control electrodes of the first and second transistors;
   (c) applying a differential output signal produced by the primary differential circuit stage between control electrodes of third and fourth transistors of a secondary differential circuit stage;
   (d) applying an output signal produced by the secondary differential circuit stage to a control electrode of a fifth transistor having a first current-carrying electrode coupled to a supply voltage conductor and a second current-carrying electrode coupled to the control electrodes of one of the third and fourth transistors to maintain equal voltages on second current-carrying electrodes of the first and second transistors.

19. A low distortion differential amplifier circuit, comprising in combination:
   (a) first and second transistors of a primary differential circuit stage and means for applying a differential input signal between control electrodes of the first and second transistors;
   (b) means for applying a differential output signal produced by the primary differential circuit stage between control electrodes of third and fourth transistors of a secondary differential circuit stage;
   (c) means for applying an output signal produced by the secondary differential circuit stage to a control electrode of a fifth transistor having a first current-carrying electrode coupled to a supply voltage conductor and a second current-carrying electrode coupled to the control electrodes of one of the third and fourth transistors to maintain substantially equal voltages on second current-carrying electrodes of the first and second transistors.

20. A low distortion differential amplifier circuit, comprising in combination:
   (a) a differential input circuit producing an intermediate differential input signal in response to a differential input signal applied between inputs of the differential input circuit;
   (b) a primary differential circuit stage including first and second transistors, means for applying a bias voltage to control electrodes of the first and second transistors, and means for applying the intermediate differential input signal between first current-carrying electrodes of the first and second transistors;
   (c) a secondary differential circuit stage including third and fourth transistors, and means for applying a differential output signal produced by the primary differential circuit stage between control electrodes of the third and fourth transistors;
   (d) means for applying an output signal produced by the secondary differential circuit stage to a control electrode of a fifth transistor having a first current-carrying electrode coupled to a supply voltage conductor and a second current-carrying electrode coupled to the control electrodes of one of the third and fourth transistors to maintain equal voltages on second current-carrying electrodes of the first and second transistors.

* * * * *